United States Patent
Yu et al.

(10) Patent No.: US 10,481,448 B2
(45) Date of Patent: Nov. 19, 2019

(54) LIQUID CRYSTAL DISPLAY

(71) Applicants: HannStar Display (Nanjing) Corporation, Nanjing (CN); HANNSTAR DISPLAY CORPORATION, Taipei (TW)

(72) Inventors: Chia-Hua Yu, New Taipei (TW); Sung-Chun Lin, Tainan (TW); Hsuan-Chen Liu, Kaohsiung (TW); Chien-Ting Chan, Tainan (TW)

(73) Assignees: HANNSTAR DISPLAY (NANJING) CORPORATION, Nanjing (CN); HANNSTAR DISPLAY CORPORATION, Taipei (TW)

( * ) Notice: Subject to any disclaimer, the term of this patent is extended or adjusted under 35 U.S.C. 154(b) by 0 days.

(21) Appl. No.: 15/350,498

(22) Filed: Nov. 14, 2016

(65) Prior Publication Data

US 2017/0139292 A1     May 18, 2017

(30) Foreign Application Priority Data

Nov. 17, 2015    (CN) .......................... 2015 1 0791133

(51) Int. Cl.
    *G11C 19/28*       (2006.01)
    *G02F 1/1362*      (2006.01)
    (Continued)

(52) U.S. Cl.
    CPC .... *G02F 1/136204* (2013.01); *G02F 1/13306* (2013.01); *G02F 1/136286* (2013.01); *G09G 3/3648* (2013.01); *G11C 19/28* (2013.01); *G11C 19/287* (2013.01); *G02F 1/13454* (2013.01); *G09G 3/3677* (2013.01);
    (Continued)

(58) Field of Classification Search
    CPC .............. H01L 27/124; H01L 27/3276; H01L 27/0248; H01L 27/0296; H01L 27/0292; H01L 27/0266; H01L 27/0255; H01L 27/1244; H01L 27/0288; H01L 23/60; G09G 2300/0426; G09G 2330/04; G09G 2330/00; G02F 1/136286; G02F 1/136204;
    (Continued)

(56) References Cited

U.S. PATENT DOCUMENTS

2008/0055505 A1* 3/2008 Yeh ................... G02F 1/136204
                                                        349/40
2008/0094533 A1* 4/2008 Ker ..................... H01L 27/0248
                                                        349/40

(Continued)

FOREIGN PATENT DOCUMENTS

| CN | 1928640 A    | 3/2007 |
| CN | 1964055 A    | 5/2007 |
| CN | 103928444 A  | 7/2014 |

OTHER PUBLICATIONS

SIPO. Office Action, dated Sep. 5, 2018. 11 pages.

*Primary Examiner* — Nitin Patel
*Assistant Examiner* — Amen Woldesenbet Bogale
(74) *Attorney, Agent, or Firm* — Muncy, Geissler, Olds & Lowe, P.C.

(57) ABSTRACT

A liquid crystal display device includes a plurality of pixel units, an electrode line surrounding the pixel units, at least one gate driver coupled with the pixel units via a plurality of gate lines, and at least one electrostatic discharge protection circuit coupled with the at least one gate driver and the electrode line.

11 Claims, 6 Drawing Sheets

(51) Int. Cl.
*G02F 1/133* (2006.01)
*G09G 3/36* (2006.01)
*G02F 1/1345* (2006.01)

(52) U.S. Cl.
CPC ........... *G09G 2300/0408* (2013.01); *G09G 2310/0286* (2013.01); *G09G 2310/08* (2013.01); *G09G 2330/04* (2013.01)

(58) Field of Classification Search
CPC ............ G02F 1/1368; G02F 2201/50; G02F 2202/22; G06F 2203/04107
See application file for complete search history.

(56) References Cited

U.S. PATENT DOCUMENTS

| | | | |
|---|---|---|---|
| 2008/0136986 A1* | 6/2008 | Kim | G02F 1/136204 349/40 |
| 2013/0106811 A1* | 5/2013 | Hirabayashi | G02F 1/136204 345/204 |
| 2014/0145182 A1* | 5/2014 | Yamazaki | H01L 27/124 257/43 |
| 2014/0177780 A1* | 6/2014 | Qi | G09G 3/20 377/64 |
| 2015/0054724 A1* | 2/2015 | Wang | G09G 3/3648 345/98 |
| 2015/0115271 A1* | 4/2015 | Yoon | H01L 27/0255 257/72 |
| 2015/0302934 A1* | 10/2015 | Qi | G11C 19/184 377/54 |
| 2016/0148922 A1* | 5/2016 | Kim | H01L 27/0255 361/56 |
| 2016/0172623 A1* | 6/2016 | Lee | H01L 51/5253 257/40 |

\* cited by examiner

LIQUID CRYSTAL DISPLAY

BACKGROUND OF THE INVENTION

1. Field of the Invention

The present invention relates to a liquid crystal display (LCD) device, in particular, to a liquid crystal display device with an electrostatic discharge protection circuit.

2. Description of the Prior Art

In recent years, the thin-film transistor (TFT) panel technology continues to progress. For example, the driving circuit integrated into the panel, such as system on glass (SOG) technology, can be manufactured by amorphous silicon (a-Si) process, low-temperature poly-silicon (LTPS) process, or InGaZnO (IGZO).

Recently, the high-resolution liquid crystal display devices with slim border are developed increasingly. No matter the TFTs are manufactured by amorphous silicon (a-Si) process, low-temperature poly-silicon (LTPS) process or InGaZnO (IGZO) metal-oxide process, etc., the gate driving circuit is a key factor of the border width. For example, the gate driving circuits integrated into the panel to replace the gate driver IC can reduce the area of routing lines in the non-display region, so that the width of the border can be reduced. In addition, the cost can be reduced because the gate driver IC and the IC bonding process are not needed in the technology of gate driving circuits integrated into the panel. However, with the design of gate driving circuits integrated into the panel, the electrostatic discharge damage to the driving circuit and the pixel circuit may become serious.

Conventional liquid crystal display mainly adopts the thin-film transistor diodes, metal-insulator-metal diodes, lightning rod pattern designs or series impedance type, etc., to prevent the pixel circuits in the LCD panel from being damaged by the electrostatic discharge (ESD). However, the ESD event may occur anywhere in the panel and damage the devices in the panel. For example, if the ESD event occurs in the conductive line between the controller and the gate driving circuit, the ESD may damage TFT elements of the gate driving circuit and the gate driving circuit may not function properly if the characteristics of the TFT element are abnormal due to the ESD damage.

SUMMARY OF THE INVENTION

In view of the above problems of the prior art, one object of the present invention is to provide a liquid crystal display device, which includes a plurality of pixel units; an electrode line; at least one gate driver coupled with the pixel units via a plurality of gate lines; at least one electrostatic discharge protection circuit coupled with the at least one gate driver and coupled with the electrode line.

In one embodiment of the present invention, the at least one gate driver includes a plurality of signal lines and a plurality of shift registers, a plurality of control signals are transmitted to the shift registers through the signal lines.

In one embodiment of the present invention, the electrostatic discharge protection circuit may include a first transistor and a second transistor, wherein the first transistor has a first gate, a first source and a first drain; the second transistor has a second gate, a second source and a second drain; the first gate; one of the first drain and the first source and one of the second drain and the second source are electrically connected together and are electrically connected to one of the signal lines; and the second gate, another of the second drain and the second source and another of the first drain and the first source are electrically connected together and are electrically connected to the electrode line.

In one embodiment of the present invention, the electrostatic discharge protection circuit may include a first transistor, a second transistor and a third transistor, wherein the first transistor has a first gate, a first source and a first drain; the second transistor has a second gate, a second source and a second drain; the third transistor has a third gate, a third source and a third drain; the first gate, one of the first drain and the first source and one of the third drain and the third source are electrically connected together and are electrically connected to one of the signal lines, the second gate, one of the second drain and the second source and another of the third drain and the third source are electrically connected together and are electrically connected to the electrode line; and the third gate, another of the first drain and the first source and another of the second drain and the second source are electrically connected together.

Another object of the present invention is to provide a liquid crystal display, which includes a plurality of pixel units; a first electrode line; at least one gate driver coupled with the pixel units via a plurality of gate lines; at least one first electrostatic discharge protection circuit coupled with the at least one gate driver and coupled with the first electrode line; a second electrode line; at least one second electrostatic discharge protection circuit coupled with the at least one gate driver and coupled with the second electrode line.

DETAILED DESCRIPTION OF THE PREFERRED EMBODIMENT

The following will disclose a plurality of embodiments with texts and drawings. For a clear illustration, many details in practice will be described in the following description. However, it should be understood that the details of the practical application of these embodiments are not to limit the present invention. In addition, for the sake of simplifying the drawings, some of the conventional structures and components in the drawings will be depicted in a simplified schematic manner. Moreover, in all drawing for describing the embodiments, parts having identical functions are given the same symbol and their repeated explanations are omitted. In addition, when an element is referred to as being "coupled with" or "coupled to" another element, it can be directly connected to the another element or be indirectly connected to the another element with one or more intervening elements interposed therebetween. Also, when an element is referred to as being "electrically connected to" another element, it can be directly electrically connected to the another element or be indirectly electrically connected to the another element with one or more intervening elements interposed therebetween.

Figure 1:
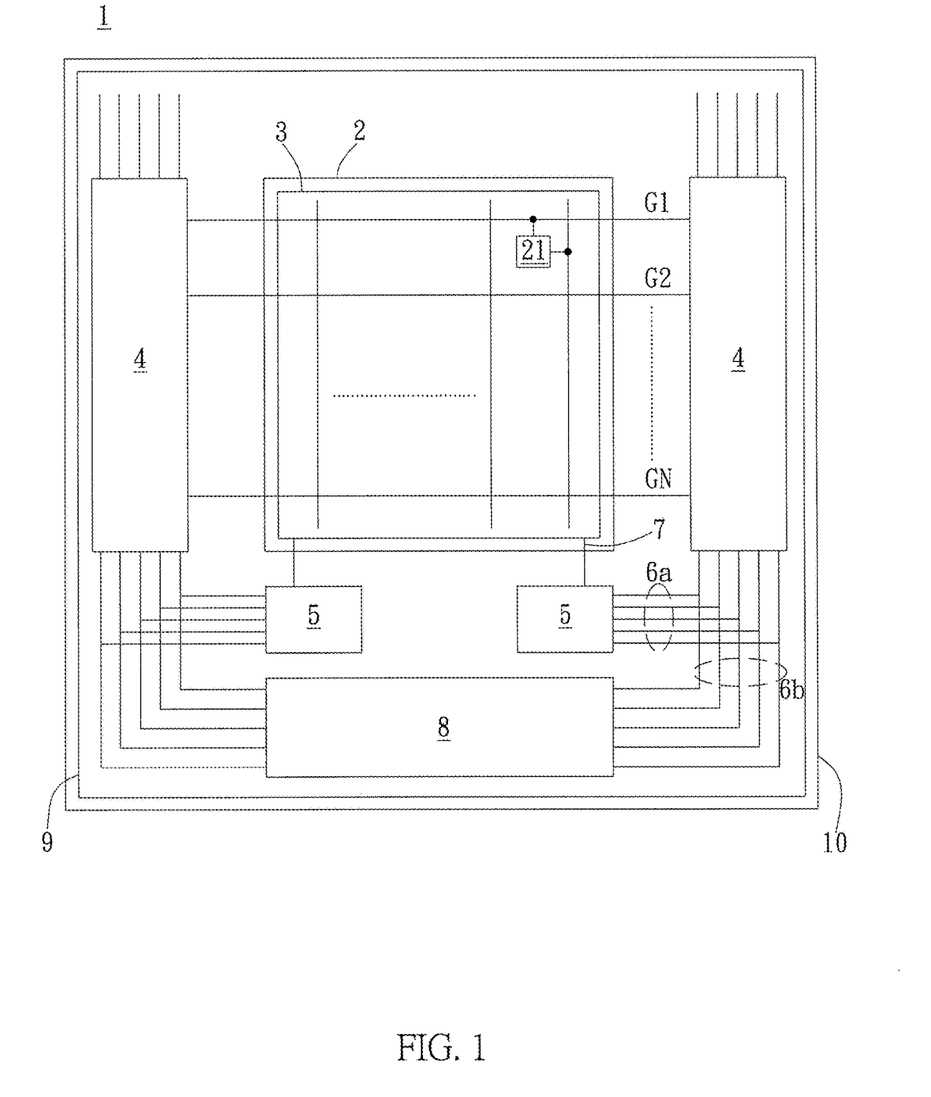
FIG. 1 schematically illustrates a liquid crystal display device according to a preferred embodiment of the present invention.

Referring to FIG. 1, FIG. 1 schematically illustrates a liquid crystal display according to a preferred embodiment of the present invention. As shown in FIG. 1, the liquid crystal display device 1 is divided into an active region 2 (or called a display region) and a non-active region (or called a non-display region) outside the active region 2. The liquid crystal display device 1 includes a plurality of pixel units 21, a first electrode line 3, gate drivers 4, electrostatic discharge protection circuits 5, a controller 8, and a second electrode line 9. Each of the pixel units 21 includes a thin-film transistor (TFT), which may be made by amorphous silicon (a-Si) process, low-temperature poly-silicon (LTPS) process or InGaZnO (IGZO) process. The circuit of the gate driver 4 may be any type of gate driving circuit. In this embodiment, the driving circuit of the gate driver 4 includes multi-stage shift registers. It is noted that, although two gate drivers 4 are illustrated in FIG. 1 and the gate drivers 4 are disposed at two opposite sides of the active region 2, the number and the location of the gate driver 4 is not limited in the invention. For example, in another embodiment, the number of the gate driver 4 may be one or larger than two. In some embodiments, the gate drivers 4 are disposed at two opposite sides of the active region 2, and each of the gate lines G1~GN is driven by the opposite two gate drivers 4. In other embodiments, the gate drivers 4 are disposed at two opposite sides of the active region 2 and respectively drive odd-numbered gate lines (e.g. G1, G3 . . . ) and even-numbered gate lines (e.g. G2, G4 . . . ). In addition, in some embodiments, one or more gate drivers 4 are disposed at one side of the active region 2 and drive the gate lines G1~GN. In other words, in the present invention, the liquid crystal display device 1 comprises at least one gate driver 4, and the at least one gate driver 4 is coupled with the pixel units 21 via a plurality of gate lines G1~GN.

The pixel units 21 are arranged in an array and are disposed on the active region 2. Although FIG. 1 illustrates that the shape of the active region 2 is rectangular, the scope of the invention is not limited thereto. In other words, the shape of the active region 2 may be non-rectangular. For example, in other embodiments, the shape of the non-rectangular active region 2 may be circular, oval, triangular, trapezoidal, heart-shaped or other irregular shapes. The first electrode line 3 is disposed to surround the pixel units 21. The gate driver 4 is configured to generate gate driving signals and the gate driving signals are transmitted to the pixel units 21 via a plurality of gate lines G1~GN. The electrostatic discharge protection circuit 5 is coupled with the gate driver 4 via conducting lines 6a and connecting lines 6b and coupled with the first electrode line 3 via a connection line 7. The controller 8 is coupled with the gate driver 4 via the connecting lines 6b and coupled with the electrostatic discharge protection circuit 5 via the connecting lines 6b and the conducting lines 6a. In this embodiment, the controller 8 is coupled with the gate driver 4 via the connecting lines 6b so that the controller 8 can apply the controlling signals (e.g. clock signal, forward input signal, backward input signal) to the driving circuit of the gate driver 4. In addition, although FIG. 1 illustrates that the controller 8, the gate drivers 4 and the electrostatic discharge protection circuits 5 are disposed on a substrate 10, the scope of the invention is not limited thereto. In other words, the controller 8 may alternatively be disposed outside the substrate 10. For example, in other embodiments, a plurality of pads are formed on the substrate 10 and are electrically connected to the connecting lines 6b, the controller 8 is disposed outside the substrate 10 and is electrically connected to the pads to apply the controlling signals to the driving circuit of the gate driver 4. In other words, in some embodiments, the controller 8 may be disposed on a flexible substrate, and the flexible substrate is coupled to the pads on the substrate 10 so that the controller 8 is electrically connected to the connecting lines 6b. In other embodiments, the controller 8 may be disposed on a printed circuit board, and the printed circuit board is coupled to the pads on the substrate 10 through a FPC (Flexible Printed Circuit) so that the controller 8 is electrically connected to the connecting lines 6b. In the present embodiment, the controller 8 may be a controller IC or a driver IC which can output the controlling signals to the gate driver 4, or the controller 8 may be a controlling circuit formed on the substrate 10, but not limited thereto.

It is noted that, although FIG. 1 illustrates that the first electrode line 3 is disposed on the active region 2, the scope of the invention is not limited thereto. In other words, the first electrode line 3 may alternatively be disposed outside the active region 2 and surround the pixel units 21.

In the embodiments of the invention, the liquid crystal display device 1 is a system on glass (SOG) display device and the gate driver 4 is also referred to integrated gate drivers (IGD) or gate drivers on array (GOA). As such, the driving circuit of the gate driver 4 includes a plurality of thin film transistors (TFTs). For illustration, TFTs in the driving circuit of the gate driver 4 may be formed along with those in the pixel units 21 by the same process.

In this embodiment, the electrostatic discharge protection circuit 5 is electrically connected to the connecting lines 6b between the controller 8 and the gate driver 4 via the conducting lines 6a. In brief, the electrostatic discharge protection circuit 5 is disposed between the controller 8 and the gate driver 4. When the electrostatic discharge (ESD) event occurs, the surge current due to the ESD event in the connecting line 6b between the controller 8 and the gate driver 4 can be distributed to the first electrode line 3 through the electrostatic discharge protection circuit 5 and the connection line 7, so as to avoid the circuit element (e.g. TFT) of the gate driver 4 from being damaged by the electrostatic discharge event. Although two electrostatic discharge protection circuits 5 are illustrated in FIG. 1 and the electrostatic discharge protection circuits 5 are electrically connected to the gate drivers 4 disposed at two opposite sides of the active region 2, the number and the location of the electrostatic discharge protection circuits 5 is not limited in the invention. In other words, in the present invention, the liquid crystal display device 1 comprises at least one gate driver 4 and at least one electrostatic discharge protection circuit 5, and the at least one electrostatic discharge protection circuit 5 is coupled with the at least one gate driver 4. In addition, although the electrostatic discharge protection circuits 5 electrically connected to the first electrode line 3 is illustrated in FIG. 1, the scope of the invention is not limited thereto. In other words, the electrostatic discharge protection circuits 5 may alternatively be electrically connected to the second electrode line 9.

It should be noted that, in the present embodiment, a common voltage (or called Vcom) is applied to the first electrode line 3, and the first electrode line 3 is also named a first common electrode line, but not limited thereto. In other words, any conductive line for distributing the ESD current away can be coupled to the electrostatic discharge protection circuit 5 of the present embodiment to protect the gate drivers 4 from being damaged by the ESD event. For example, in other embodiments, a ground voltage, a gate low voltage (VGL) or other fixed voltage may be applied to the first electrode line 3. Similarly, in the present embodiment, a common voltage is applied to the second electrode line 9, and the second electrode line 9 is also named a second common electrode line, but not limited thereto. In other embodiments, a ground voltage, a gate low voltage (VGL) or other fixed voltage may be applied to the second electrode line 9.

In this embodiment, the first electrode line 3 is a conductive ring surrounding the pixel units 21, the second electrode line 9 is a conductive ring surrounding the pixels units 21, the first electrode line 3, the gate drivers 4 and the electrostatic discharge protection circuit 5, but not limited thereto. Because the first electrode line 3 is adjacent to the pixel units 21 and the second electrode line 9 is adjacent to the edge of the liquid crystal display device 1, the first electrode line 3 is also named an inner conductive ring and the second electrode line 9 is also named an outer conductive ring. It is noted that, although two electrode lines are illustrated in FIG. 1, the number of the electrode lines is not limited in the invention. For example, in another embodiment, only the first electrode line 3 is disposed on the substrate 10. In other embodiment, only the second electrode line 9 is disposed on the substrate 10 and the electrostatic discharge protection circuits 5 may alternatively be electrically connected to the second electrode line 9. In addition, as shown in FIG. 1, the first electrode line 3 forms an enclosed ring surrounding the pixels units 21, and the second electrode line 9 forms an enclosed ring surrounding the pixels units 21, the first electrode line 3, the gate drivers 4 and the electrostatic discharge protection circuits 5, the scope of the invention is not limited thereto. In some embodiments, one of the first electrode line 3 and the second electrode line 9 forms an enclosed ring, and another of the first electrode line 3 and the second electrode line 9 forms a non-enclosed ring. In another embodiment, both the first electrode line 3 and the second electrode line 9 form non-enclosed rings.

Figure 2A:
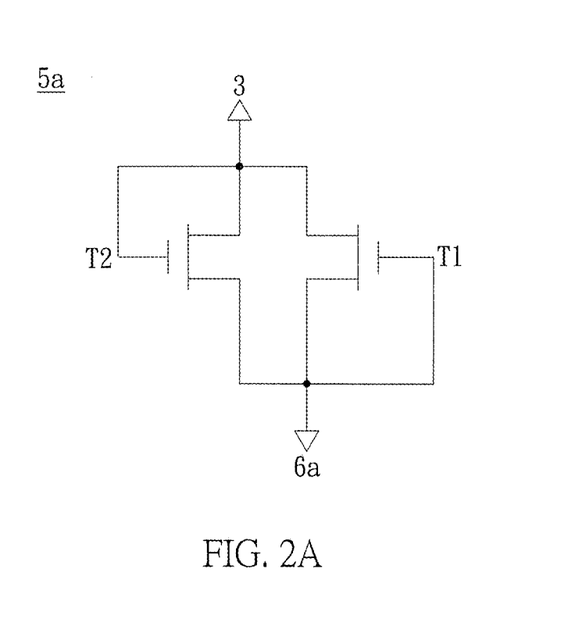
FIG. 2A schematically illustrates an electrostatic discharge protection circuit according to a preferred embodiment of the present invention.

Referring to FIG. 2A, FIG. 2A schematically illustrates an electrostatic discharge protection circuit according to a preferred embodiment of the present invention. As shown in FIG. 2A, the electrostatic discharge protection circuit 5 includes an electrostatic discharge protection device 5a comprising a first transistor T1 and a second transistor T2. The first terminal and second terminal of the first transistor T1 and the third terminal of the second transistor T2 are electrically connected together and are coupled with the conducting line 6a. The first terminal and second terminal of the second transistor T2 and the third terminal of the first transistor T1 are electrically connected together and are coupled with the first electrode line 3 through the connection line 7. In this embodiment, the first terminal of a transistor is gate electrode, the second terminal of the transistor is one of the drain electrode and the source electrode, and the third terminal of the transistor is another of the drain electrode and the source electrode and the source electrode. It should be noted that the first transistor T1 and the second transistor T2 may be P-type or N-type.

Figure 2B:
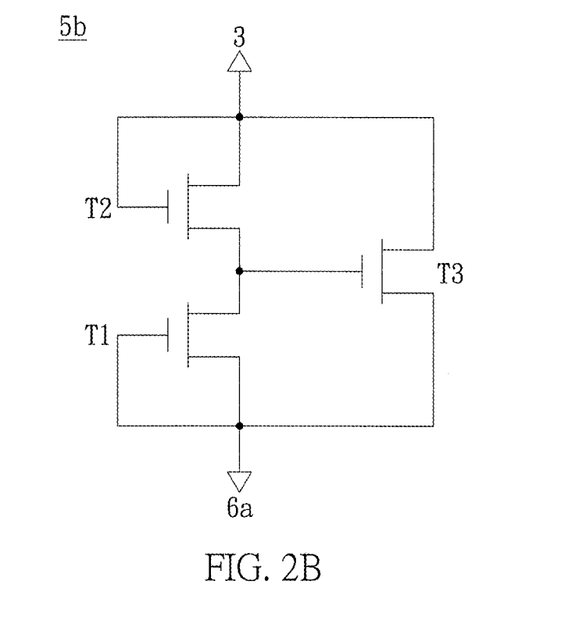
FIG. 2B schematically illustrates an electrostatic discharge protection circuit according to another preferred embodiment of the present invention.

Referring to FIG. 2B, FIG. 2B schematically illustrates an electrostatic discharge protection circuit according to another preferred embodiment of the present invention. As shown in FIG. 2B, the electrostatic discharge protection circuit 5 includes an electrostatic discharge protection device 5b comprising a first transistor T1, a second transistor T2, and a third transistor T3. In this present embodiment, the first terminal and second terminal of the first transistor T1 and the second terminal of the third transistor T3 are electrically connected together and are coupled with the conducting line 6a. The first terminal and second terminal of the second transistor T2 and the third terminal of the third transistor T3 are electrically connected together and are coupled with the first electrode line 3 through the connection line 7. The first terminal of the third transistor T3, the third terminal of the second transistor T2 and the third terminal of the first transistor T1 are electrically connected together. It should be noted that the first transistor T1, the second transistor T2 and the third transistor T3 may be P-type or N-type. Similarly, in this embodiment, the first terminal of a transistor is gate electrode, the second terminal of the transistor is one of the drain electrode and the source electrode, and the third terminal of the transistor is another of the drain electrode and the source electrode.

It is noted that, although one electrostatic discharge protection device 5a is illustrated in FIG. 2A and one electrostatic discharge protection device 5b is illustrated in FIG. 2B, the number of the electrostatic discharge protection device in the electrostatic discharge protection circuit 5 is not limited in the invention. For example, in another embodiment, if the number of the connecting lines 6b is N, where N is an integer greater than or equal to 2, and the electrostatic discharge protection circuit 5 is coupled with the connecting lines 6b through N number of the conducting lines 6a, the number of the electrostatic discharge protection devices in the electrostatic discharge protection circuit 5 is also N, and each of the electrostatic discharge protection devices is electrically connected to a respective one of the N number of the conducting lines 6a.

In the embodiments of the invention, the transistors of the electrostatic discharge protection circuit 5 are thin film transistors (TFTs), and TFTs of the gate driver 4, the electrostatic discharge protection circuit 5 and the unit pixel 21 can be formed together by the same process. For illustration, TFTs in the driving circuit of the gate driver 4 and the electrostatic discharge protection circuit 5 may be formed along with those in the pixel units 21 by the same process.

It should be noted, the electrostatic discharge protection circuits in the above two embodiments are merely illustrative and not to limit the structure of the electrostatic discharge protection circuit of the present invention. In other words, any circuit with the electrostatic discharge protection function can be applied to the present invention.

Figure 3:
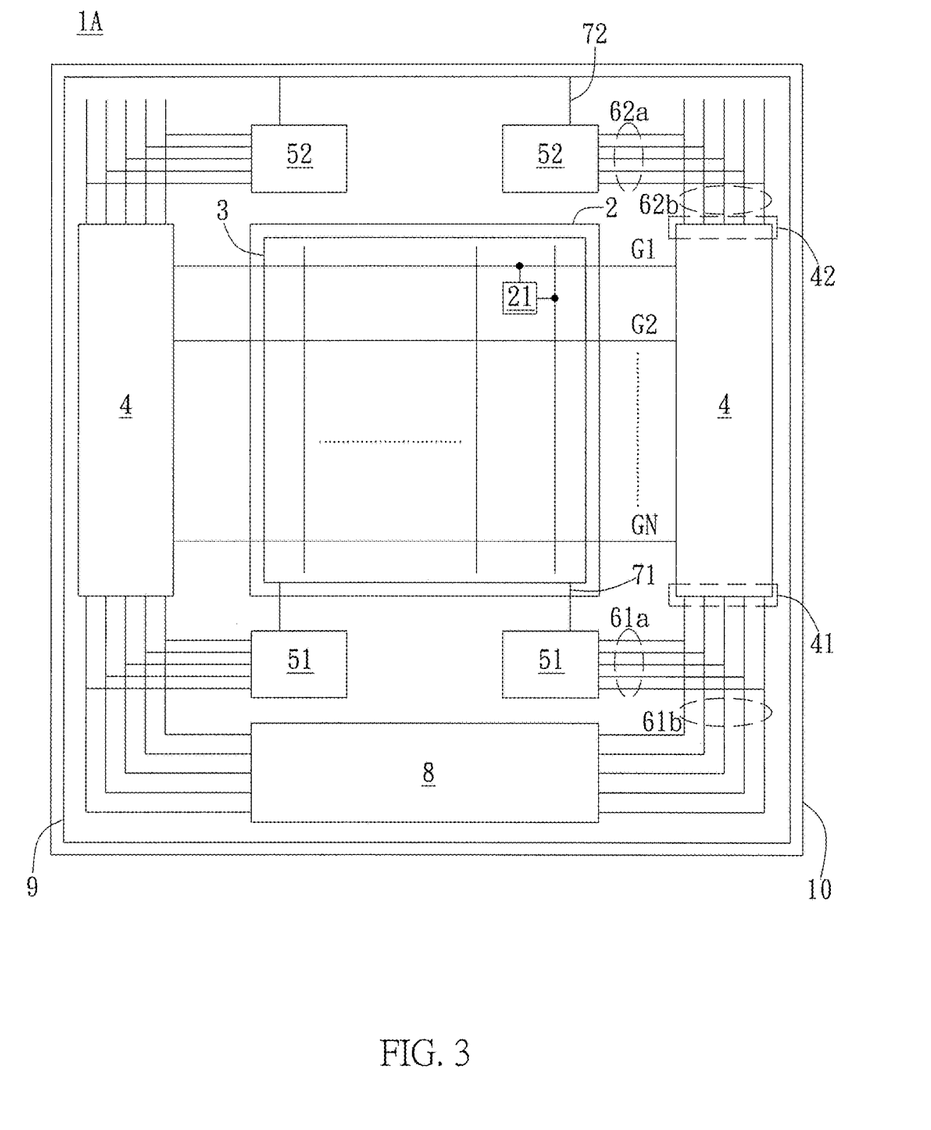
FIG. 3 schematically illustrates a liquid crystal display device according to another preferred embodiment of the present invention.

Referring to FIG. 3, FIG. 3 schematically illustrates a liquid crystal display device according to another preferred embodiment of the present invention. As shown in FIG. 3, the liquid crystal display device 1A includes a plurality of pixel units 21, a first electrode line 3, gate drivers 4, first electrostatic discharge protection circuits 51, second electrostatic discharge protection circuits 52, a controller 8, and a second electrode line 9.

As shown in FIG. 3, the first electrostatic discharge protection circuit 51 is coupled with a front end 41 of the gate driver 4 via first conducting lines 61a and first connecting lines 61b and coupled with the first electrode line 3 via a first connection line 71. The controller 8 is coupled with the gate driver 4 via the first connecting lines 61b and coupled with the first electrostatic discharge protection circuit 51 via the first connecting lines 61b and the first conducting lines 61a. In this embodiment, the controller 8 is coupled with the gate driver 4 via the first connecting lines 61b so that the controller 8 can apply the controlling signals (e.g. clock signal, forward input signal, backward input signal) to the driving circuit of the gate driver 4.

Similar to the embodiment of FIG. 1, the first electrostatic discharge protection circuit 51 is electrically connected to the first connecting lines 61b between the controller 8 and the front end 41 of the gate driver 4 via the first conducting lines 61a. When the electrostatic discharge (ESD) event occurs, the ESD surge current in the connecting line 61b between the controller 8 and the gate driver 4 can be distributed to the first electrode line 3 through the first conducting line 61a, the first electrostatic discharge protection circuit 51 and the first connection line 71, so as to avoid the circuit elements (e.g. TFTs) of the gate driver 4 from being damaged by the electrostatic discharge event. It is noted that, the first electrostatic discharge protection circuit 51 includes the electrostatic discharge protection device shown in FIG. 2A or FIG. 2B, but not limited thereto.

As shown in FIG. 3, the second electrostatic discharge protection circuit 52 is coupled with a back end 42 of the gate driver 4 via second conducting lines 62a and second connecting lines 62b and coupled with the second electrode line 9 via a second connection line 72. When the electrostatic discharge (ESD) event occurs, the ESD surge current in the second connecting line 62b can be distributed to the second electrode line 9 through the second conducting line 62a, the second electrostatic discharge protection circuit 52 and the second connection line 72, so as to avoid the circuit elements of the gate driver 4 from being damaged by the electrostatic discharge event. It should be noted that, in other embodiments, the first electrostatic discharge protection circuit 51 may be coupled to the second electrode line 9, while the second electrostatic discharge protection circuit 52 may be coupled to the first electrode line 3. Similarly, the second electrostatic discharge protection circuit 52 includes the electrostatic discharge protection device shown in FIG. 2A or FIG. 2B, but not limited thereto.

Figure 4:
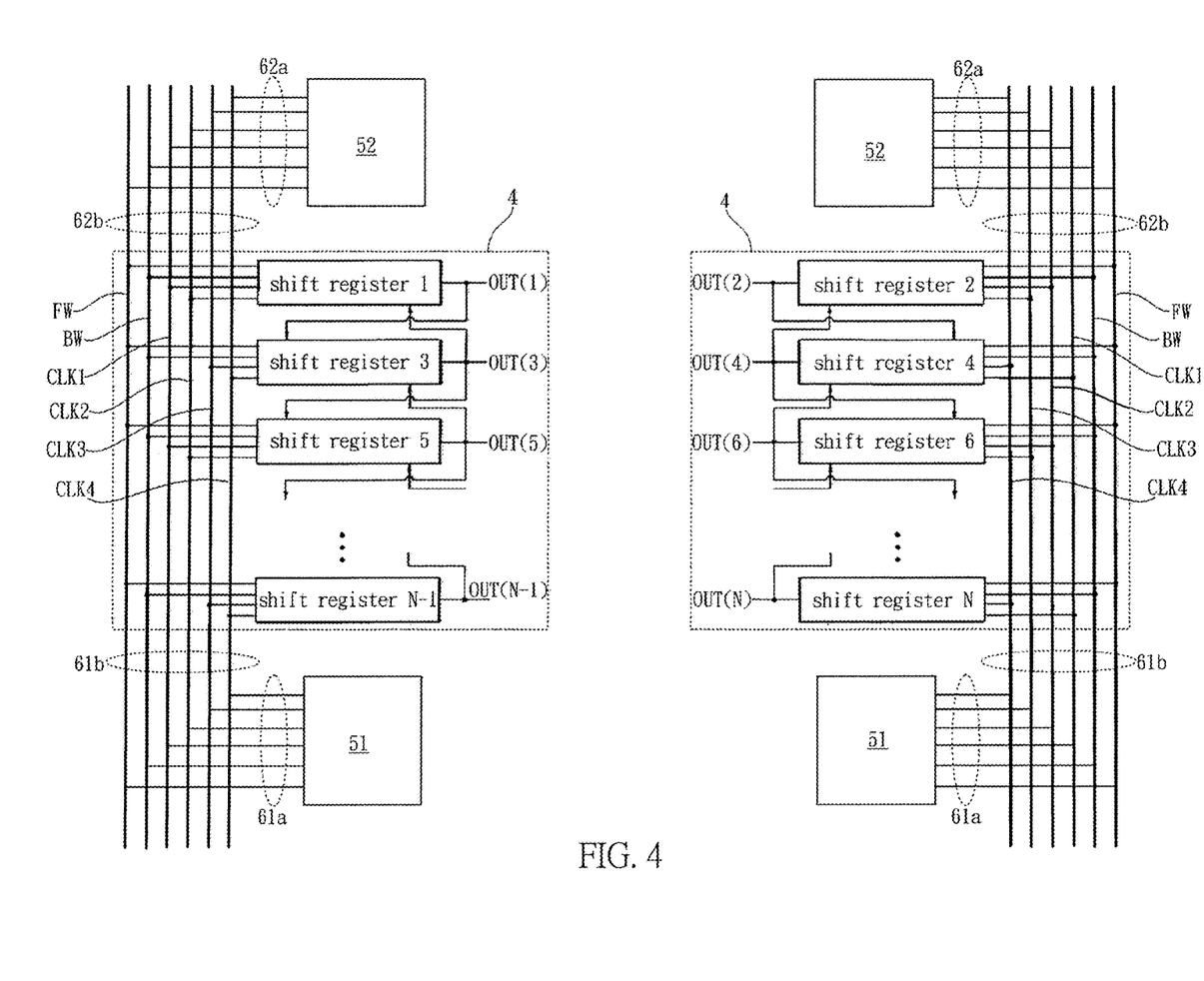
FIG. 4 schematically illustrates a driving circuit of a gate driver according to a preferred embodiment of the present invention.
Figure 5:
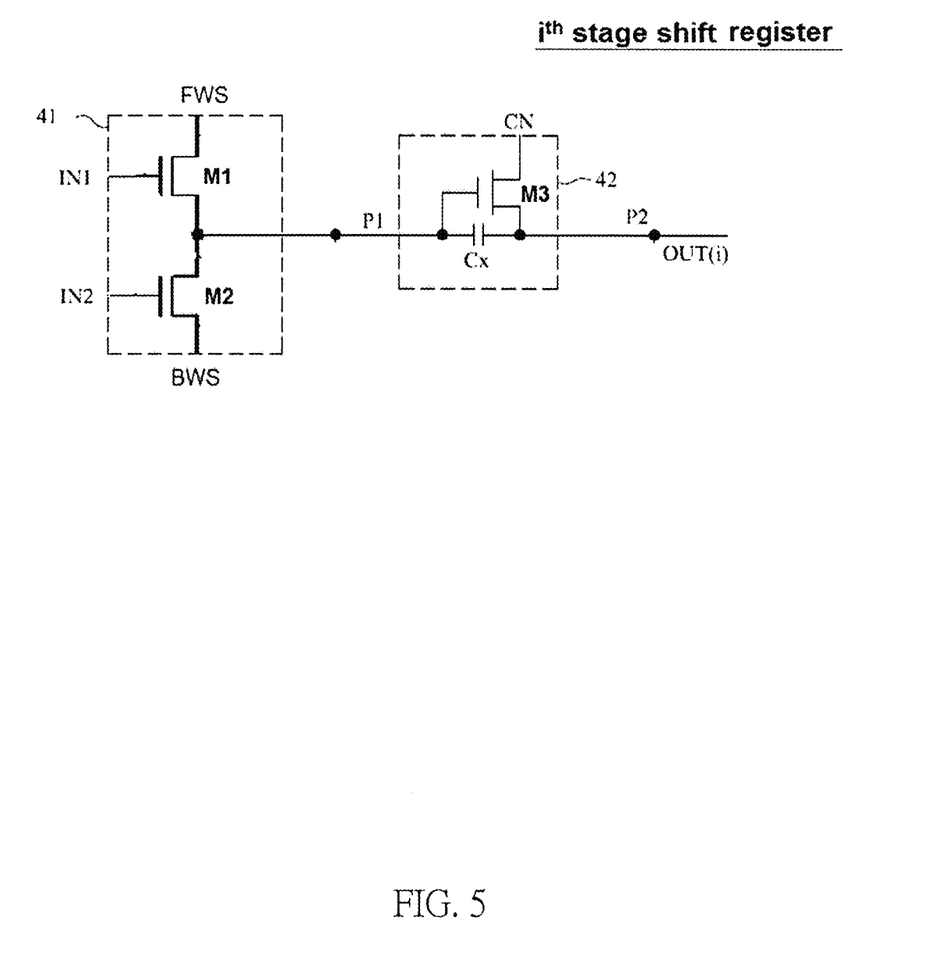
FIG. 5 schematically illustrates an equivalent circuit block diagram of $i^{th}$ shift register in FIG. 4 according to a preferred embodiment of the present invention.

Referring to FIG. 4 and FIG. 5, FIG. 4 illustrates a schematic diagram of a driving circuit of the gate driver 4 in accordance with some embodiments of the invention, and FIG. 5 illustrates an equivalent circuit block diagram of $i^{th}$ shift register in FIG. 4. The driving circuits of the gate drivers 4 include a plurality of signal lines and N stage shift registers. The signal lines include clock signal lines CLK1~CLK4, forward input signal lines FW and backward input signal lines BW. As shown in FIG. 4, the clock signals lines CLK1-CLK4, the forward input signal line FW and the backward signal line BW are electrically connected to the first connecting lines 61b and the second connecting lines 62b, and the clock signals lines CLK1-CLK4, the forward input signal line FW and the backward signal line BW respectively provide the clock signals, the forward signal and the backward signal to the corresponding shift register. In addition, in some embodiments, the signal lines may further include a starting signal line and an ending signal line. The starting signal line is configured to provide a starting signal to the $1^{st}$ stage shift register, and the ending signal line is configured to provide an ending signal to the $N^{th}$ stage shift register. The shift registers are configured to provide scan signals OUT(1)~OUT(N) to the gate lines G1~GN, respectively. It is noted that, although two gate drivers 4 are illustrated in FIG. 4 and the gate drivers 4 are disposed at two opposite sides of the active region 2, the number and the location of the gate driver 4 is not limited in the invention. In addition, for the sake of simplifying the drawings, the first connection line 71, the first electrode line 3, the second connection line 72 and the second electrode line 9 are omitted in FIG. 4.

As shown in FIG. 5, the $i^{th}$ stage shift register circuit includes a pre-charge unit 41 and a pull-up unit 42. The pre-charge unit 41 receives input signals IN1, IN2, and outputs a pre-charge signal at a node P1 based on the input signals IN1, IN2. For example, in some embodiments, the input signal IN1 is the scan signal OUT(i−2) outputted by the $(i-2)^{th}$ stage shift register circuit, and the input signal IN2 is the scan signal OUT(i+2) outputted by the $(i+2)^{th}$ stage shift register circuit, but the scope of the invention is not limited thereto. Moreover, the pre-charge unit 41 further receives a forward input signal FWS from the forward input signal line FW and a backward input signal BWS from the backward input signal line BW, such that the driving circuits of the gate drivers 4 drive the pixel units 21 of the active region 2 row by row in a forward or backward scanning sequence based on the forward input signal FWS and the backward input signal BWS. The pre-charge unit 41 includes transistors M1 and M2. The first terminal and second terminal of the transistors M1 are configured to receive the input signal IN1 and the forward input signal FWS respectively, and the first terminal and second terminal of the transistors M2 are configured to receive the input signal IN2 and backward input signal BWS respectively, the third terminal of the transistor M1 is electrically connected to the third terminal of the transistor M2. In this embodiment, the first terminal of a transistor is gate electrode, the second terminal of the transistor is one of the drain electrode and the source electrode, and the third terminal of the transistor is another of the drain electrode and the source electrode.

The pull-up unit 42 is coupled to the pre-charge unit 41, and is configured to receive the pre-charge signal and a clock signal CN and to output the scan signal OUT(i) via a node P2 based on the pre-charge signal and the clock signal CN which is one of the clock signals from the clock lines CK1-CK4. The pull-up unit 42 includes a transistor M3 and a capacitor Cx. The first terminal of the transistor M3 is configured to receive the pre-charge signal, the second terminal of the transistor M3 is configured to receive the clock signal CN, and the third terminal of the transistor M3 is configured to output the scan signal OUT(i). The capacitor Cx includes two opposite electrodes, one of the electrodes of the capacitor Cx is coupled to the first terminal of the transistor M3, and another of the electrodes of the capacitor Cx is coupled to the third terminal of the transistor M3.

It is noted that, in some embodiments, the $i^{th}$ stage shift register circuit further includes pull-down unit. The pull-down unit is coupled to the pre-charge unit 41 and the pull-up unit 42, and is configured to receive the pre-charge signal and pull-down control signals and control whether to pull down the scan signal OUT(i) to a reference voltage level based on the pre-charge signal and the pull-down control signals.

Because the second terminal of the transistor M3 is coupled to one the clock signal lines CK1~CK4 to receive the clock signal CN, the transistor M3 is possibly damaged if the ESD current is not distributed away from the clock signal lines CK1~CK4. Similarly, Because the second terminal of the transistor M1 is coupled to the forward input signal line FW and the second terminal of the transistor M2 is coupled to the backward input signal line BW, the transistor M1 or M2 is possibly damaged if the ESD current is not distributed away from the input signal line FW and the backward input signal line BW.

Referring to FIG. 3 and FIG. 4, the clock signal lines CK1~CK4, the forward input signal line FW and the backward signal line BW are electrically connected to the first connecting lines 61b and the second connecting lines 62b. When the ESD event occurs, the ESD current in the clock signal lines CK1~CK4, the forward input signal line FW, the backward signal line BW, the first connecting lines 61b and the second connecting lines 62b can be distributed to the first electrode line 3 through the first conducting lines 61a, the first electrostatic discharge protection circuit 51 and the first connection line 71, and can be distributed to the second electrode line 9 through the second conducting lines 62a, the second electrostatic discharge protection circuit 52 and the second connection line 72, so as to avoid the circuit element of the driving circuit of the gate driver 4 from being damaged by the electrostatic discharge event.

Briefly, in this embodiment, the first electrostatic discharge protection circuit 51 is coupled to the front end 41 of the gate driver 4 and the second electrostatic discharge protection circuit 52 is coupled to the back end 42 of the gate driver 4 to protect the gate driver 4 from being damaged by the ESD event.

It should be noted that, in some embodiments, when the voltage applied to the first electrode line 3 is the same as the voltage applied to the second electrode line 9, the first electrode line 3 and the electrode line 9 can be electrically connected together through a conductive line disposed on the substrate 10, but the scope of the invention is not limited thereto.

In practice, because the electrostatic discharge event may occur in any region of the liquid crystal display device, according to the design of the present invention, the electrostatic discharge protection circuits 51, 52 are coupled to the front end 41 and the back end 42 of the gate driver 4 respectively to achieve a more comprehensive ESD protection result.

Figure 6:
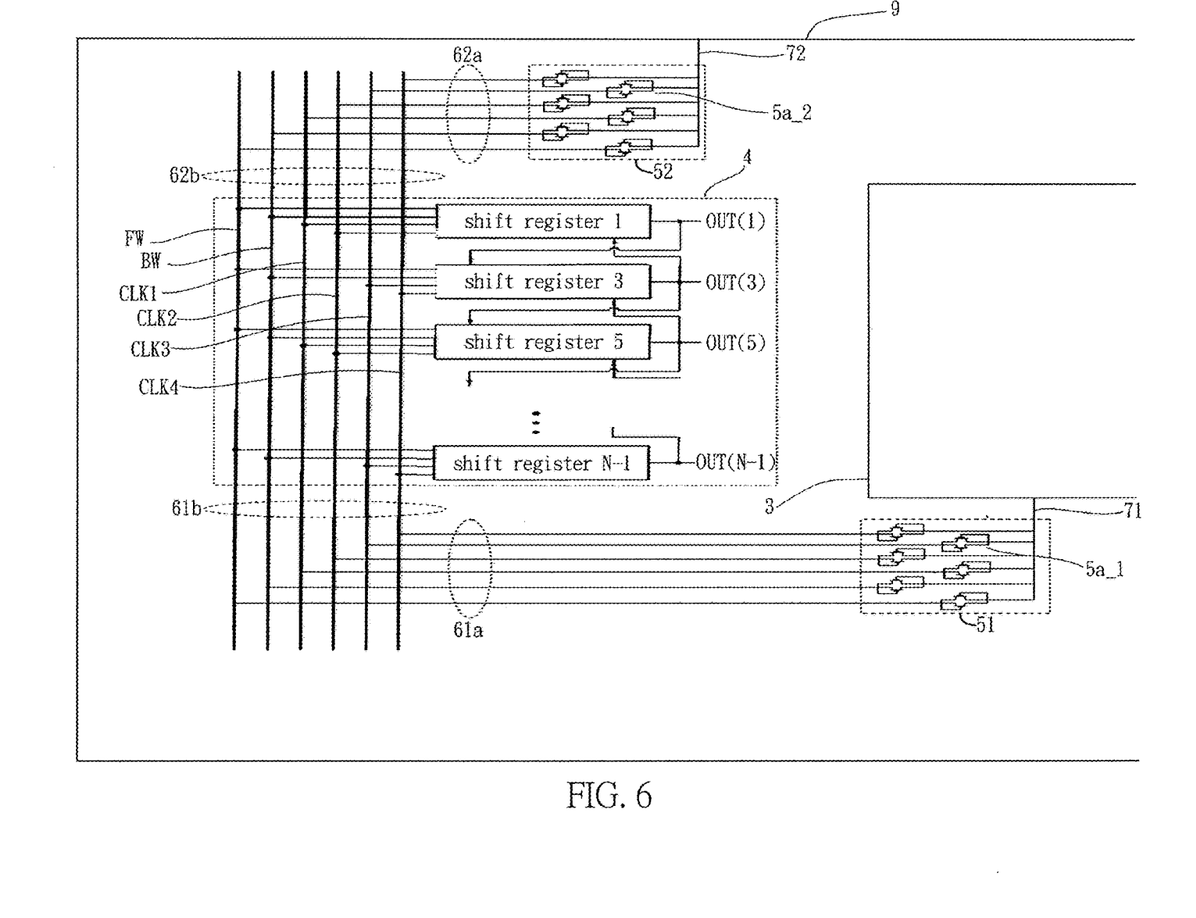
FIG. 6 schematically illustrates a first electrostatic discharge protection circuit, a second electrostatic discharge protection circuit, a driving circuit of a gate driver, a first electrode line and a second electrode line according to a preferred embodiment of the present invention.

Referring to FIG. 6, FIG. 6 illustrates a schematic diagram of a first electrostatic discharge protection circuit 51, a second electrostatic discharge protection circuit 52, a driving circuit of the gate driver 4, a first electrode line 3 and a second electrode line 9 in accordance with some embodiments of the invention. It is noted that, FIG. 6 only illustrates a part of the first electrode line 3 and a part of the second electrode line 9 for convenience of description. The first electrostatic discharge protection circuit 51 includes a plurality of electrostatic discharge protection devices 5a_1. One end of the electrostatic discharge protection device 5a_1 is electrically connected to one of the clock signal lines CLK1~CLK4, the forward input signal line FW and the backward signal line BW, and another end of the electrostatic discharge protection device 5a_1 is electrically connected to the first electrode line 3 through a the connection line 71. Similarly, the second electrostatic discharge protection circuit 52 includes a plurality of electrostatic discharge protection devices 5a_2. One end of the electrostatic discharge protection device 5a_2 is electrically connected to one of the clock signal lines CLK1~CLK4, the forward input signal line FW and the backward signal line BW, and another end of the electrostatic discharge protection device 5a_2 is electrically connected to the second electrode line 9 through a second connection line 72. It should be noted that, although the electrostatic discharge protection devices 5a_1 and 5a_2 in this embodiment are the same as the electrostatic discharge protection device 5a shown in FIG. 2A, the electrostatic discharge protection circuits in this embodiment are merely illustrative and not to limit the structure of the electrostatic discharge protection circuit of the present invention. In other words, any circuit with the electrostatic discharge protection function can be applied to the present invention.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A liquid crystal display device, comprising:
   a plurality of pixel units;
   a first electrode line, wherein the first electrode line is an enclosed conductive ring surrounding the pixel units;
   a gate driver coupled with at least some of the pixel units via a plurality of gate lines, wherein the gate driver includes a plurality of signal lines and a plurality of shift registers coupled between the signal lines and the plurality of gate lines, and a plurality of control signals are transmitted to the shift registers through the signal lines;
   another gate driver coupled with at least some of the pixel units, wherein the gate driver and the another gate driver are respectively disposed at two opposite sides of an active region of the liquid crystal display device;
   an electrostatic discharge protection circuit coupled with the gate driver;
   another electrostatic discharge protection circuit coupled with the another gate driver, wherein the another electrostatic discharge protection circuit is electrically connected to the first electrode line;
   a second electrode line, wherein the second electrode line is a non-enclosed conductive ring surrounding the first electrode line, and the gate driver is disposed between the first electrode line and the second electrode line; and
   a conductive line, wherein the first electrode line and the second electrode line are electrically connected together through the conductive line;
   wherein a common voltage is applied to the first electrode line and the second electrode line, and the electrostatic discharge protection circuit is electrically connected to the signal lines and the first electrode line.

2. The liquid crystal display device of claim 1, wherein the control signals include at least one clock signal.

3. The liquid crystal display device of claim 1, further comprising:
   a controller coupled with the gate driver;
   wherein the controller transmits the control signals to the signal lines.

4. The liquid crystal display device of claim 1, wherein the electrostatic discharge protection circuit comprises at least one electrostatic discharge protection device, and each of the at least one electrostatic discharge protection device comprises:
   a first transistor having a first gate, a first source and a first drain; and
   a second transistor having a second gate, a second source and a second drain;
   wherein the first gate, one of the first drain and the first source and one of the second drain and the second source are electrically connected together and are electrically connected to one of the signal lines; and the second gate, the other one of the second drain and the second source and the other one of the first drain and the first source are electrically connected together and are electrically connected to the first electrode line.

5. The liquid crystal display device of claim 1, wherein the electrostatic discharge protection circuit comprises at least one electrostatic discharge protection device, and each of the at least one electrostatic discharge protection device comprises:
   a first transistor having a first gate, a first source and a first drain;
   a second transistor having a second gate, a second source and a second drain; and
   a third transistor having a third gate, a third source and a third drain;
   wherein the first gate, one of the first drain and the first source and one of the third drain and the third source are electrically connected together and are electrically connected to one of the signal lines;
   the second gate, one of the second drain and the second source, and the other one of the third drain and the third source are electrically connected together and are electrically connected to the first electrode line; and
   the third gate, the other one of the first drain and the first source and the other one of the second drain and the second source are electrically connected together.

6. The liquid crystal display device of claim 1, wherein each of the shift registers includes a pull-up unit, and the pull-up unit receives a clock signal from one of the signal lines and outputs a scan signal to one of the gate lines.

7. A liquid crystal display device, comprising:
   a plurality of pixel units;
   a first electrode line, wherein the first electrode line is an enclosed conductive ring surrounding the pixel units;
   a gate driver coupled with at least some of the pixel units via a plurality of gate lines, wherein the gate driver includes a plurality of signal lines and a plurality of shift registers coupled between the signals lines and the gate lines, and a plurality of control signals are transmitted to the shift registers through the signal lines;
   a first electrostatic discharge protection circuit coupled with a front end of the gate driver;
   a second electrode line, wherein the second electrode line is a non-enclosed conductive ring surrounding the first electrode line, and the gate driver is disposed between the first electrode line and the second electrode line;
   another gate driver coupled with at least some of the pixel units, wherein the gate driver and the another gate driver are respectively disposed at two opposite sides of an active region of the liquid crystal display device;
   another first electrostatic discharge protection circuit coupled with a front end of the another gate driver, wherein the another first electrostatic discharge protection circuit is electrically connected to the first electrode line;
   a second electrostatic discharge protection circuit coupled with a back end of the gate driver;
   another second electrostatic discharge protection circuit coupled with a back end of the another gate driver, wherein the another second electrostatic discharge protection circuit is electrically connected to the second electrode line; and
   a conductive line, wherein the first electrode line and the second electrode line are electrically connected together through the conductive line;
   wherein a common voltage is applied to the first electrode line and the second electrode line, the first electrostatic discharge protection circuit is electrically connected to the signal lines and the first electrode line, and the second electrostatic discharge protection circuit is electrically connected to the signal lines and the second electrode line.

8. The liquid crystal display device of claim 7, wherein the control signals includes at least one clock signal.

9. The liquid crystal display device of claim 7, further comprising:
   a controller coupled with the gate driver,
   wherein the controller transmits the control signals to the signal lines.

10. The liquid crystal display device of claim 7, wherein the first electrostatic discharge protection circuit comprises at least one electrostatic discharge protection device, and each of the at least one electrostatic discharge protection device comprises:
    a first transistor having a first gate, a first source and a first drain; and
    a second transistor having a second gate, a second source and a second drain;
    wherein the first gate, one of the first drain and the first source and one of the second drain and the second source are electrically connected together and are electrically connected to one of the signal lines; and
    the second gate, the other one of the second drain and the second source and the other one of the first drain and the first source are electrically connected together and are electrically connected to the first electrode line.

11. The liquid crystal display device of claim 7, wherein the first electrostatic discharge protection circuit comprises at least one electrostatic discharge protection device and each of the at least one electrostatic discharge protection device comprises:
    a first transistor having a first gate, a first source and a first drain;
    a second transistor having a second gate, a second source and a second drain; and
    a third transistor having a third gate, a third source and a third drain;
    wherein the first gate, one of the first drain and the first source and one of the third drain and the third source are electrically connected together and are electrically connected to one of the signal lines;
    the second gate, one of the second drain and the second source, and the other one of the third drain and the third source are electrically connected together and are electrically connected to the first electrode line; and
    the third gate, the other one of the first drain and the first source and the other one of the second drain and the second source are electrically connected together.

* * * * *